United States Patent [19]
Huang et al.

[11] Patent Number: 5,672,914
[45] Date of Patent: Sep. 30, 1997

[54] DIMPLE-FREE TUNGSTEN PLUG

[75] Inventors: Yuan-Chang Huang; Huang-Hui Chang, both of Hsin-Chu, Taiwan

[73] Assignee: Taiwan Semiconductor Manufacturing Company, Ltd., Hsin-Chu, Taiwan

[21] Appl. No.: 635,802

[22] Filed: Apr. 22, 1996

Related U.S. Application Data

[62] Division of Ser. No. 415,334, Apr. 3, 1995, Pat. No. 5,527,736.

[51] Int. Cl.$^6$ .......................... H01L 23/48; H01L 29/40; H01L 29/54; H01L 29/62

[52] U.S. Cl. .................. 257/763; 257/764; 257/765; 257/753

[58] Field of Search ........................ 257/763, 764, 257/745, 753, 737, 774, 780, 773, 770, 771, 751

[56] References Cited

U.S. PATENT DOCUMENTS

| | | | |
|---|---|---|---|
| 5,219,789 | 6/1993 | Adan | 437/192 |
| 5,324,689 | 6/1994 | Yoo | 437/228 |
| 5,360,995 | 11/1994 | Graas | 257/765 |
| 5,374,849 | 12/1994 | Tada | 257/763 |
| 5,430,328 | 7/1995 | Hsue | 257/763 |
| 5,523,624 | 6/1996 | Chen et al. | 257/763 |
| 5,589,713 | 12/1996 | Lee et al. | 257/770 |
| 5,623,166 | 4/1997 | Olowolafe et al. | 257/771 |

FOREIGN PATENT DOCUMENTS

| | | | |
|---|---|---|---|
| 0151857 | 5/1994 | Japan | 257/764 |
| 0168906 | 6/1994 | Japan | 257/763 |

*Primary Examiner*—Tom Thomas
*Assistant Examiner*—Alexander Oscar Williams
*Attorney, Agent, or Firm*—George O. Saile; Rosemary L. S. Pike

[57] ABSTRACT

A new method of metallization using a dimple-free tungsten plug is described. Semiconductor device structures are formed in and on a semiconductor substrate. An insulating layer is deposited overlying the semiconductor device structures. An opening is etched through the insulating layer to contact one of the semiconductor device structures. A layer of tungsten is deposited overlying the insulating layer and within the opening. The tungsten layer is coated with a layer of spin-on-glass wherein the spin-on-glass layer planarizes the top surface of the substrate. The spin-on-glass and tungsten layers are etched back leaving the tungsten layer only within the opening as a tungsten plug wherein the presence of the spin-on-glass layer overlying the tungsten layer prevents the formation of a dimple within the tungsten plug completing the formation of the dimple-free tungsten plug in the fabrication of an integrated circuit.

5 Claims, 2 Drawing Sheets

DIMPLE-FREE TUNGSTEN PLUG

This application is a divisional application of Ser. No. 08/415,334, filed Apr. 3, 1995, now U.S. Pat. No. 5,527,736.

BACKGROUND OF THE INVENTION

(1) Field of the Invention

The invention relates to a method of metallization in the fabrication of integrated circuits, and more particularly, to a method of tungsten metallization which avoids dimple formation during tungsten etchback resulting in improved step coverage in the manufacture of integrated circuits.

(2) Description of the Prior Art

The conventional tungsten etching back process has an inevitable dimple formation at the center of the tungsten plug hole. The dimple feature will result in bad metal step coverage across the tungsten plug during metal deposition after tungsten etching back. This problem will become progressively worse at higher levels of metallization if the stacked via scheme is implemented.

Referring now to FIG. 1, there is illustrated a conventional tungsten plug process of the prior art. There is shown semiconductor substrate 10 in which have been formed source/drain regions 14. Gate electrode 18 has been formed overlying gate silicon oxide layer 16. A contact hole has been opened through insulating layer 20 to source/drain region 14. Glue layer 22 has been deposited over the surface of the substrate and within the contact hole. A layer of tungsten 24 has been deposited over the surface of the glue layer within the contact hole.

Referring now to FIG. 2, the tungsten is etched back using conventional SF6/N2 plasmas, resulting in recess 25 and dimple 26. This dimple formation will degrade the metal deposition conformity across the tungsten plug. A metal void may occur at metal level 3 or 4 if stacked via and tungsten plug methods are implemented. The dimple may also increase the difficulty of intermetal dielectric planarization.

Workers in the art have tried to avoid the tungsten plug dimple problem by using thick chemical vapor deposited {CVD}tungsten on the order of 8000 Angstroms for a 0.8 μm plug hole to improve tungsten deposition conformity and to alleviate the dimple problem in etching back. However, the dimple problem still occurs because overetching is inevitable.

U.S. Pat. No. 5,324,689 to Yoo discloses the use of spin-on-glass to planarize a polysilicon layer under photoresist for improved etching.

SUMMARY OF THE INVENTION

A principal object of the present invention is to provide an effective and very manufacturable method of dimple-free tungsten plug metallization.

In accordance with the object of this invention a new method of metallization using a dimple-free tungsten plug is achieved. Semiconductor device structures are formed in and on a semiconductor substrate. An insulating layer is deposited overlying the semiconductor device structures. An opening is etched through the insulating layer to contact one of the semiconductor device structures. A layer of tungsten is deposited overlying the insulating layer and within the opening. The tungsten layer is coated with a layer of spin-on-glass wherein the spin-on-glass layer planarizes the top surface of the substrate. The spin-on-glass and tungsten layers are etched back leaving the tungsten layer only within the opening as a tungsten plug wherein the presence of the spin-on-glass layer overlying the tungsten layer prevents the formation of a dimple within the tungsten plug completing the formation of the dimple-free tungsten plug in the fabrication of an integrated circuit.

BRIEF DESCRIPTION OF THE DRAWINGS

In the accompanying drawings forming a material part of this description, there is shown.

DESCRIPTION OF THE PREFERRED EMBODIMENTS

Figure 1:
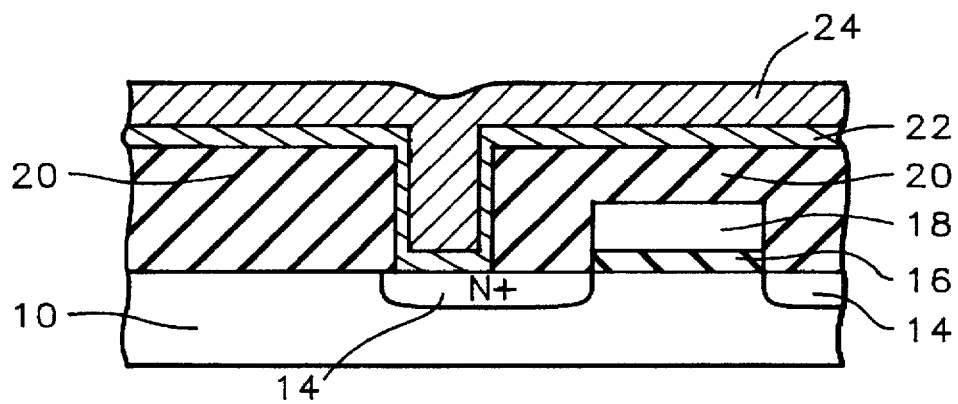
FIGS. 1 and 2 schematically illustrate in cross-sectional representation a conventional tungsten plug process of the prior art.
Figure 2:
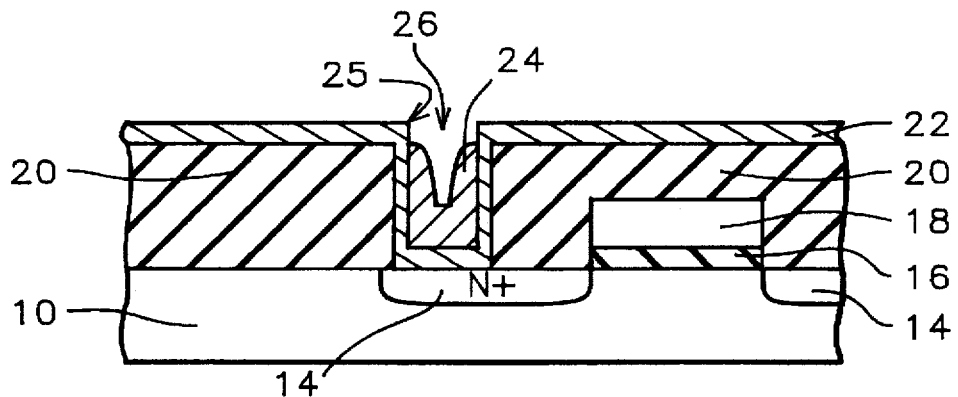
Figure 3:
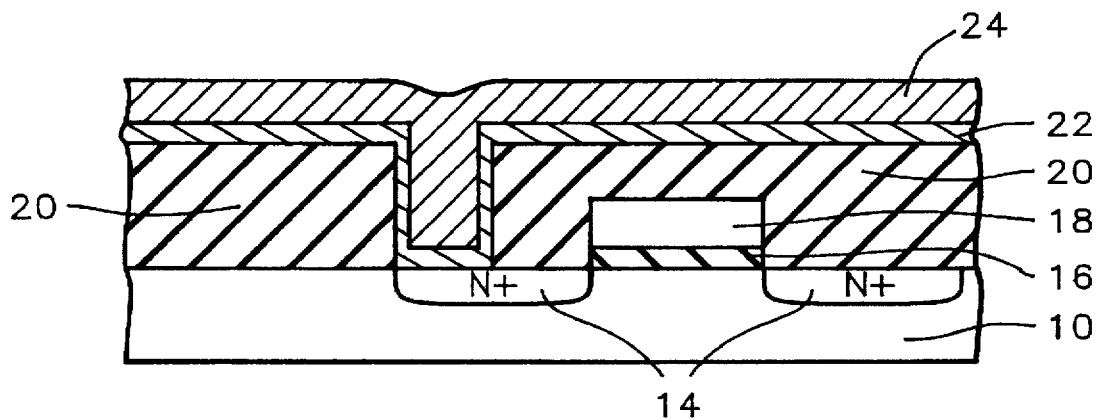
FIGS. 3 through 6 schematically illustrate in cross-sectional representation a preferred embodiment of the present invention.

Referring now more particularly to FIG. 3, there is illustrated a portion of a partially completed integrated circuit. There is shown a semiconductor substrate 10, preferably composed of monocrystalline silicon. Source/drain regions 14 are formed as is understood in the art either before or after formation of the gate electrode 18 overlying gate silicon oxide layer 16.

An insulating layer 20, composed of borophosphosilicate glass (BPSG), borosilicate glass (BSG), or phosphosilicate glass (PSG), or the like is deposited over the surface of the semiconductor structures to a thickness of between about 5000 to 9000 Angstroms. A contact hole is opened through the insulating layer 20 to the source/drain region 14 within the semiconductor substrate. A glue layer 22 is deposited conformally over the surface of the insulating layer 20 and within the contact hole. The glue layer preferably is composed of titanium and titanium nitride. The glue layer 22 is deposited by plasma sputtering to a thickness of between about 400 to 1200 Angstroms.

A layer of tungsten 24 is deposited by low pressure chemical vapor deposition (LPCVD) over the glue layer to fill the contact hole. The novel process of the present invention will now be described.

Figure 4:
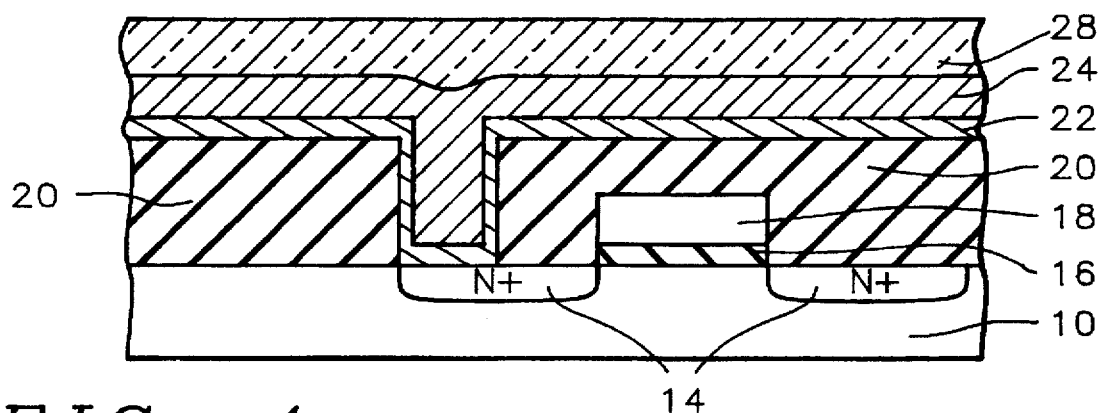

Referring now to FIG. 4, a layer of spin-on-glass 28 is coated over the tungsten layer. The spin-on-glass material, either silicate or siloxane, suspended in the vehicle or solvent is deposited onto the semiconductor wafer surface and uniformly spread thereover by the action of spinning the wafer, for example, at 3500 revolutions per minute. The spin-on-glass layer 28 smooths the integrated circuit wafer surface. The spin-on-glass layer is then cured as is conventional. The spin-on-glass layer planarizes the tungsten deposition profile and creates a thicker spin-on-glass at the center of the plug hole.

Figure 5:
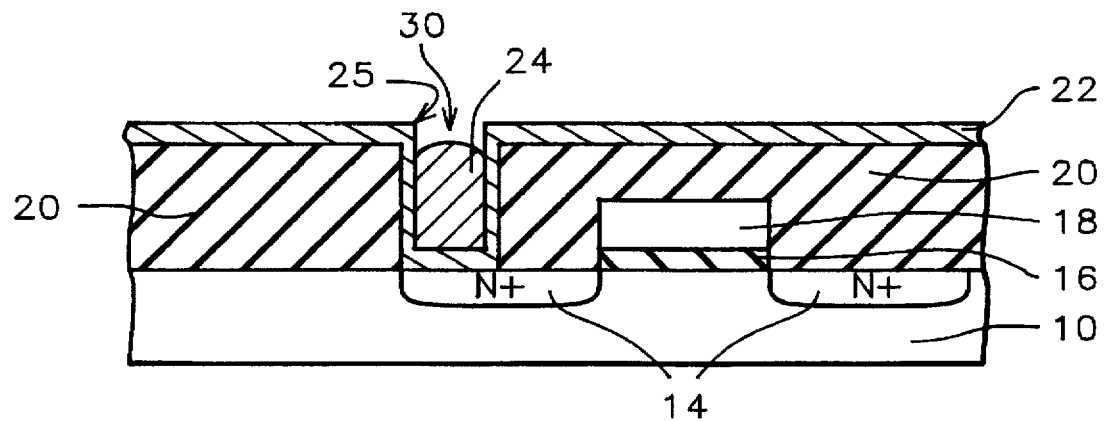

The spin-on-glass and tungsten layers are etched back using conventional $SF_6$ and $N_2$ plasmas, but in a ratio resulting in a higher etch rate in tungsten than in spin-on-glass. During spin-on-glass/tungsten etching back, the high selectivity of tungsten to spin-on-glass etching recipe will create a bump etch profile when endpoint is achieved. During overetching, this bump-like tungsten plug profile will be preserved until the end of the etching process. The overetching recipe is similar to the main etch, but has a higher selectivity to titanium nitride. The bump-like tungsten plug profile 30 is illustrated in FIG. 5.

The recess 25 still exists after etching is complete, but the dimple is no longer formed. Experimental results have shown that a CVD tungsten thickness of between about 5000 to 6000 Angstroms can produce the best tungsten plug profile for 0.7 and 0.8 µm holes using an etching recipe with selectivity of tungsten to spin-on-glass of between about 1.4 to 1.8.

Figure 6:
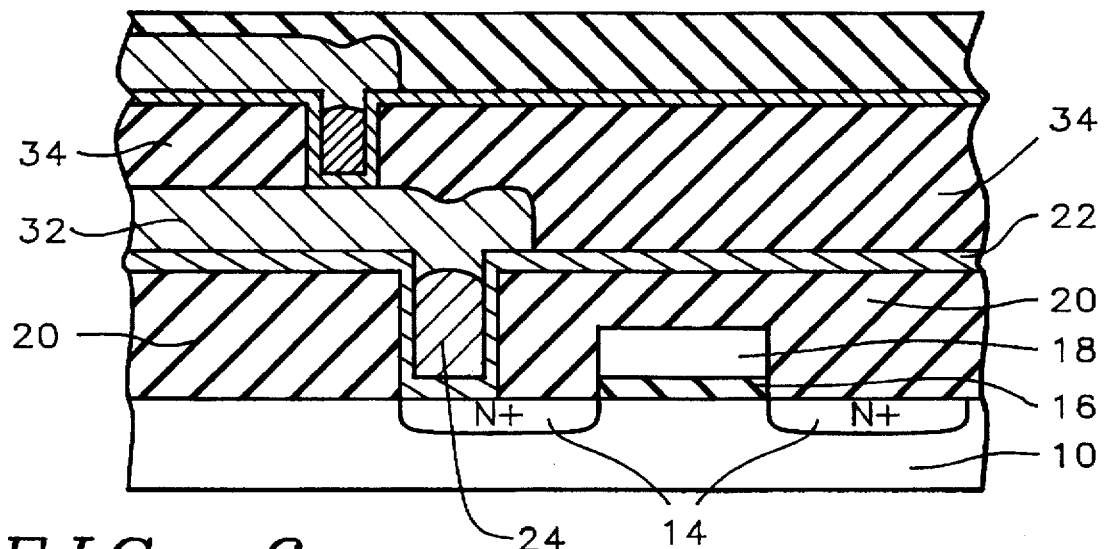

Processing continues as is conventional in the art with metal deposition and patterning. FIG. 6 shows a patterned metal layer 32, such as aluminum and an intermetal dielectric layer 34. Further levels of tungsten plugs and metallization can be fabricated using the dimple-free tungsten plug process of the present invention to complete fabrication of the integrated circuit.

The process of the invention results in the elimination of dimple problems in the tungsten etching back process. Tungsten thickness can be decreased with this process, thus increasing tungsten deposition throughput. Better metal step coverage can be achieved across the tungsten plug.

While the invention has been particularly shown and described with reference to the preferred embodiments thereof, it will be understood by those skilled in the art that various changes in form and details may be made without departing from the spirit and scope of the invention.

What is claimed is:

1. An integrated circuit device comprising:

semiconductor device structures in and on a semiconductor substrate;

an insulating layer overlying said semiconductor device structures;

a tungsten plug through said insulating layer contacting one of said semiconductor device structures wherein the profile of said tungsten plug is bump-like and wherein said tungsten plug is recessed below the surface of said insulating layer;

a glue layer overlying said insulating layer and lying between said tungsten plug and said insulating layer and between said tungsten plug and said one of said semiconductor device structures;

a first patterned metal layer overlying said glue layer and contacting said tungsten plug; and a passivation layer overlying said first patterned metal layer.

2. A device according to claim 1 wherein said semiconductor device structures include gate electrodes and source/drain regions and wherein said one of said semiconductor device structures contacted is a glue layer and contacting said tungsten plug; and a passivation layer overlying said first patterned metal layer.

3. A device according to claim 1 further comprising:

a second tungsten plug through said passivation layer contacting said first patterned metal layer wherein the profile of said second tungsten plug is bump-like and wherein said second tungsten plug is recessed below the surface of said passivation layer;

a second glue layer overlying said passivation layer and lying between said second tungsten plug and said passivation layer and between said second tungsten plug and said one of said semiconductor device structures;

a second patterned metal layer overlying said glue layer and contacting said second tungsten plug; and a second passivation layer overlying said second patterned metal layer.

4. A device according to claim 1 wherein said glue layer comprises titanium and titanium nitride.

5. A device according to claim 3 wherein said second glue layer comprises titanium and titanium nitride.

* * * * *